(12) United States Patent
Elmegreen et al.

(10) Patent No.: US 7,411,818 B1
(45) Date of Patent: Aug. 12, 2008

(54) PROGRAMMABLE FUSE/NON-VOLATILE MEMORY STRUCTURES USING EXTERNALLY HEATED PHASE CHANGE MATERIAL

(75) Inventors: Bruce G. Elmegreen, Golden Bridge, NY (US); Subramanian S. Iyer, Mount Kisco, NY (US); Deok-kee Kim, Bedford Hills, NY (US); Lia Krusin-Elbaum, Dobbs Ferry, NY (US); Dennis M. Newns, Yorktown Heights, NY (US); Byeongju Park, Plainview, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/672,110

(22) Filed: Feb. 7, 2007

(51) Int. Cl.
G11C 11/00 (2006.01)
(52) U.S. Cl. .................. 365/163; 365/148; 257/4
(58) Field of Classification Search ............ 365/113; 257/4
See application file for complete search history.

(56) References Cited

U.S. PATENT DOCUMENTS

| | | |
|---|---|---|
| 6,448,576 B1 | 9/2002 | Davis et al. |
| 6,970,034 B1 | 11/2005 | Harris |
| 7,208,751 B2 | 4/2007 | Ooishi |
| 7,221,579 B2 | 5/2007 | Krusin-Elbaum et al. |
| 7,324,365 B2* | 1/2008 | Gruening-von Schwerin et al. ............. 365/148 |
| 2005/0121789 A1 | 6/2005 | Madurawe |
| 2005/0188230 A1 | 8/2005 | Bilak |
| 2006/0278895 A1 | 12/2006 | Burr et al. |
| 2006/0279978 A1 | 12/2006 | Krusin-Elbaum et al. |
| 2007/0295948 A1 | 12/2007 | Lam et al. |
| 2008/0017842 A1 | 1/2008 | Happ et al. |
| 2008/0048169 A1* | 2/2008 | Doyle et al. ............ 257/4 |

OTHER PUBLICATIONS

"Exploring Potential Benefits of 3D FPGA Integration" 1-6 pages.
Jpn. J. Appl. Phys. vol. 40 (2001) Part 2, No. 6B, Jun. 15, 2001, "Temperature Dependence of TaSiN Thin Film Resistivity from Room Temperature to 900°C", Munenori Oizumi, Katsuhiro Aoki, and Yukio Fukuda, pp. L603-L605.
Journal of Applied Physics, vol. 86, No. 4, Aug. 15, 1999, "Modeling of laser pulsed heating and quenching in optical data storage media", C. A. Volkert and M. Wuttig, pp. 1808-1816.
J. Appl. Phys. 82 (9), Nov. 1, 1997, "Experimental and theoretical investigations of laser-induced crystallization and amorphization in phase-change optical recording media", Chubing Peng, Lu Cheng, and M. Mansurpur, pp. 4183-4191.
Physical Review Letters, vol. 64, No. 11, Mar. 12, 1990, "Asymmetric Crystallization and Melting Kinetics in Sodium: A Molecular-Dynamic Study", C. J. Tymczak and John R. Ray, pp. 1278-1281.

(Continued)

Primary Examiner—Tan T. Nguyen
(74) Attorney, Agent, or Firm—Cantor Colburn LLP; Ido Tuchman

(57) ABSTRACT

A programmable phase change material (PCM) structure includes a heater element formed at a transistor gate level of a semiconductor device, the heater element further including a pair of electrodes connected by a thin wire structure with respect to the electrodes, the heater element configured to receive programming current passed therethrough, a layer of phase change material disposed on top of a portion of the thin wire structure, and sensing circuitry configured to sense the resistance of the phase change material.

5 Claims, 16 Drawing Sheets

OTHER PUBLICATIONS

Jpn. J. Appl. Phys. vol. 42 (2003), Part 1, No. 2B, Feb. 2003, "Determination of the Crystallisation Kinetics of Fast-Growth Phase-Change Materials for Mark-Formation Prediction", Erwin R. Meinders and Martijn H. R. Lankhorst, pp. 809-812.

Science, vol. 267, Mar. 31, 1995, "Formation of Glasses from Liquids and Biopolymers", C. A. Angell, pp. 1924-1934.

Journal of Applied Physics 97, 083520 (2005), "Phase-change recording materials with a growth-dominated crystallization mechanism: A materials overview", L. van Pieterson, M. H. R. Lankhorst, M. van Schijndel, A. E. T. Kuiper, and J. H. J. Roosen, 1-7 pages.

file://C:\DOCUME~1\ADMINI~1\LOCALS~\Temp\V9K43UPW.htm, Jul. 20, 2005, "What Are CPLDs and FPGAs", 1-3 pages.

S. Lai et al; "OUM—A 180 nm Nonvaltile Memory Cell Element Technology for Stand Alone and Embedded Applications;" IEEE, 2001, pp. 36.5.1-36.5.4.

J. Maimon et al; "Chalcogenide-Based Non-Volatile Memory Technology;" IEEE; 2001 pp. 5-2289-5-2294.

Young-Tae Kim et al.; "Study on Cell Characteristics of PRAM Using the Phase-Change Simulation;" IEEE 2003; pp. 211-214.

S. Tyson et al.; "Nonvolatile, High Density, High Performance Phase-Change Memory;" IEEE 2000; pp. 385-390.

C.J. Glassbrenner et al.; "Thermal Conductivity of Silicon and Germanium from 3° K to the Melting Point*;" Physical Review vol. 134, No. 4A; May 18, 1964; pp. A1058-A1069.

U.S. Appl. No. 11/958,298, filed Dec. 17, 2007.

U.S. Appl. No. 11/833,321, filed Aug. 3, 2007.

U.S. Appl. No. 11/833,354, filed Aug. 3, 2007.

\* cited by examiner

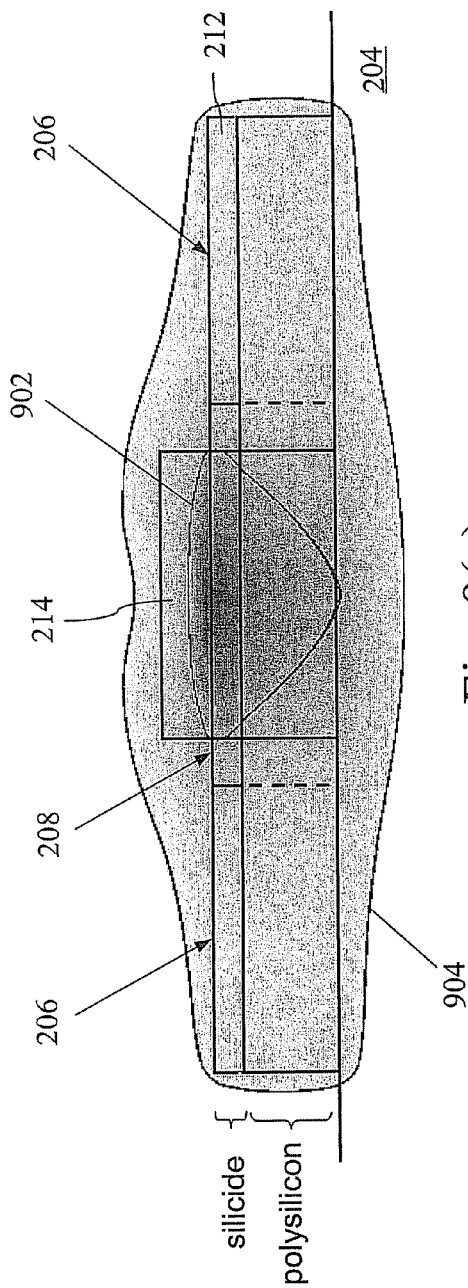
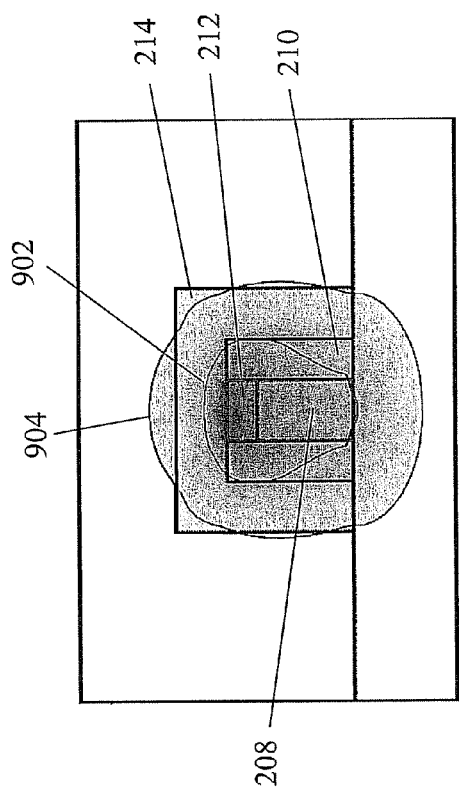
Fig. 9(a)
Fig. 9(b)

| Silicide Property | C54-TiSi$_2$ | CoSi$_2$ | NiSi |
|---|---|---|---|
| Thin Film Resistivity ($\mu\Omega$-cm) | 15-25 | 15-20 | 10-25 |
| Silicide Thickness / Si consumption – normalized to metal thickness | 2.4 / 2.3 | 3.5 / 3.6 | 2.2 / 1.8 |
| Melting temperature (°C) | 1500 | 1326 | 992 |
| Formation Temperature (°C) | 750-850 | 600-750 | 300-500 |
| Controlling Formation mechanism | Nucleation | Nucleation / Diffusion | Diffusion |
| Diffusing Species | Si | Si & Co [a] | Ni |
| Limitations | Transformation C49 → C54 | Rise in Rs of narrow lines, roughness, SiGe | High temperature degradation |

[a] Co for Co$_2$Si, Si for CoSi and Co for CoSi$_2$ if formed at low T. For CoSi$_2$ at high temperature, both elements diffuse similarly.

Fig. 10
(Prior Art)

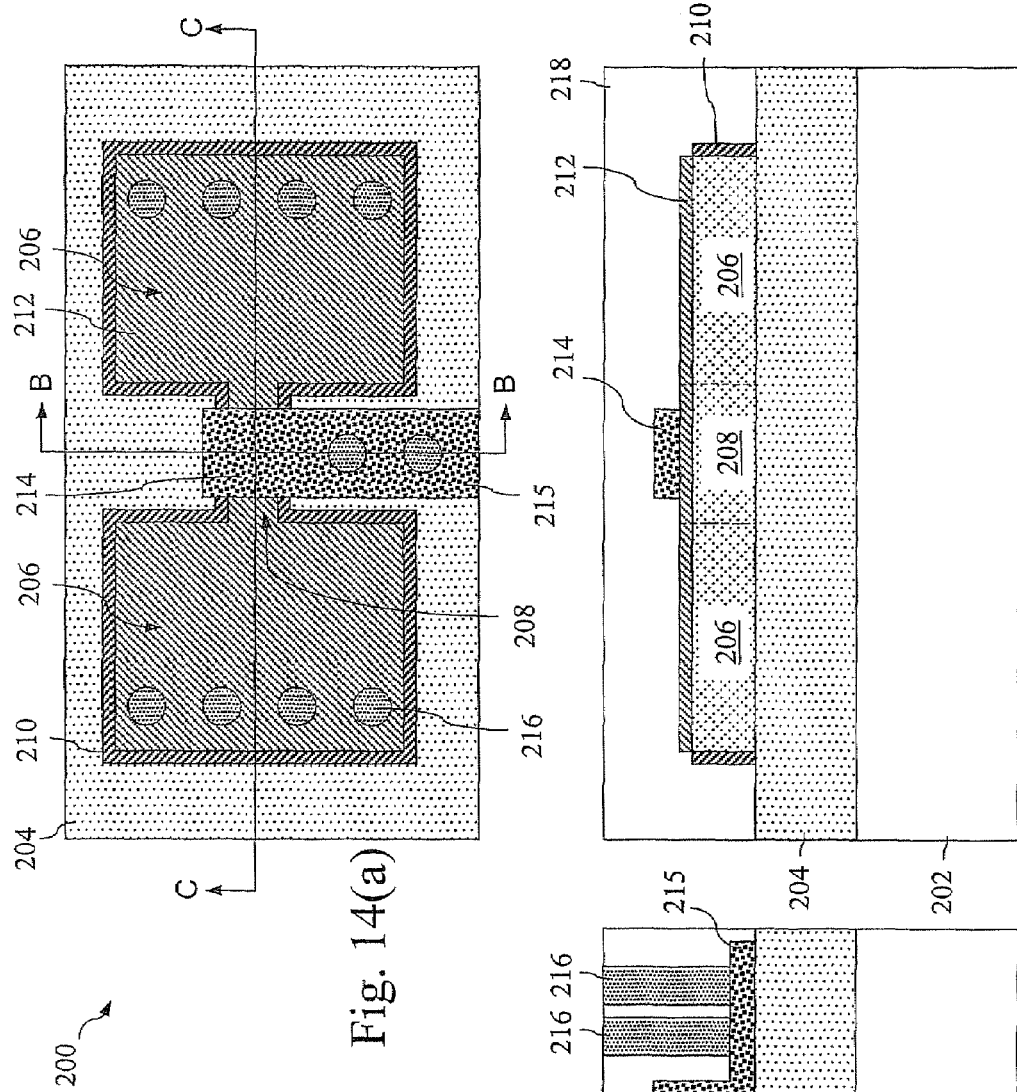
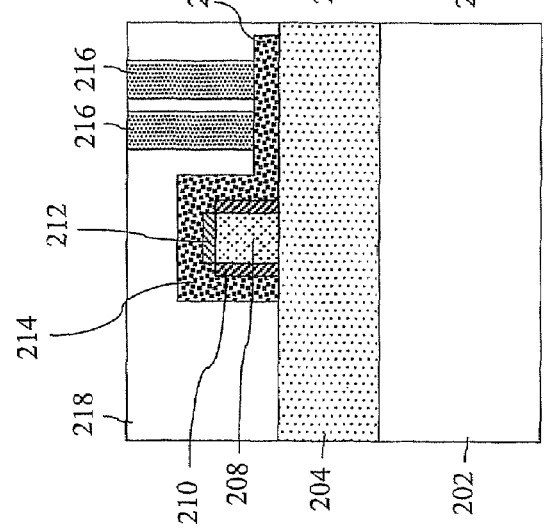
Fig. 14(a)
Fig. 14(b)
Fig. 14(c)

PROGRAMMABLE FUSE/NON-VOLATILE MEMORY STRUCTURES USING EXTERNALLY HEATED PHASE CHANGE MATERIAL

BACKGROUND

The present invention relates generally to integrated circuit devices and, more particularly, to programmable fuse/non-volatile memory structures (and arrays) using externally heated phase change material.

Electrically programmable fuse (eFUSE) devices have many practical applications such as, for example, redundancy implementation in memory arrays, field programmable arrays, voltage trimming resistors/capacitors, RF circuit tuning, electronic chip identification, usage tracking/diagnostic data logging, remote disabling of a device/car that is reported stolen, read only memory (ROM), etc. Existing eFUSE technology is based on various different techniques such as, for example, electromigration (IBM), rupture (Infineon) and agglomeration (Intel). However, each of these existing fuse technologies are "one-shot," in that once the fuse is blown, it cannot be returned to a conducting state. Moreover, such devices occupy relatively large areas, involve large amounts of power/current, and are very slow to program (e.g., several microseconds).

On the other hand, reprogrammable fuses utilizing chalcogenide materials (and indirect heating through a resistive heater) are described in U.S. Pat. No. 6,448,576 to Davis et al. However, such chalcogenide fuse materials emit large amounts of heat, and it is estimated that switching currents needed to produce the required programming heat are on the order of about 15 mA. Under this assumption, a required heater current of 15 mA would in turn result in a design that is inconveniently large, requiring a driver FET width on the order of about 15 microns.

Accordingly, as eFUSE technology develops, it will be desirable to be able to address existing concerns pertaining to higher performance, including factors such as: reducing the device area taken up by the fuse, cope with the "sunsetting" of the non-standard high voltages/currents required by existing programmable fuse devices, the desirability of having multi-shot reprogrammable fuses, and enhanced speed, among other aspects.

SUMMARY

The foregoing discussed drawbacks and deficiencies of the prior art are overcome or alleviated by a programmable phase change material (PCM) structure. In an exemplary embodiment, the structure includes a heater element formed at a transistor gate level of a semiconductor device, the heater element further including a pair of electrodes connected by a thin wire structure with respect to the electrodes, the heater element configured to receive programming current passed therethrough, a layer of phase change material disposed on top of a portion of the thin wire structure, and sensing circuitry configured to sense the resistance of the phase change material.

In another embodiment, a non-volatile, programmable phase change material (PCM) memory array includes a plurality of memory cells arranged in rows and columns, with each memory cell comprising a heater element formed at a transistor gate level of a semiconductor device; the heater element further including a pair of electrodes connected by a thin wire structure with respect to the electrodes; the heater element configured to receive programming current passed therethrough; a layer of phase change material disposed on top of a portion of the thin wire structure; and sensing circuitry configured to sense the resistance of the phase change material.

In still another embodiment, a method of forming a programmable phase change material (PCM) structure includes forming a polysilicon layer over a semiconductor substrate, at a location corresponding to a transistor gate level of a semiconductor device; patterning the polysilicon layer so as to define a pair of electrodes and a thin wire structure connecting the electrodes; forming a silicide metal layer over the patterned polysilicon layer so as to define a heater element; and forming a layer of phase change material disposed on top of a portion of the thin wire structure of the heater element; wherein the portions of the silicide metal layer corresponding to the thin wire structure in contact with a portion of the phase change material are configured to selectively heat the portion of phase change material in a manner that programs the phase change material into one of a low resistance crystalline state and a high resistance amorphous state.

BRIEF DESCRIPTION OF THE DRAWINGS

Referring to the exemplary drawings wherein like elements are numbered alike in the several Figures:

FIGS. 9(a) and 9(b) illustrate temperature contours resulting from a PCM heating simulation of a device similar to the embodiment of FIG. 2;

FIG. 10 is a table listing properties of various silicide metals used in CMOS processing; and FIGS. 11 through 14 are top and cross-sectional views illustrating a more detailed, sequential description of an exemplary method of forming the device of FIG. 2.

DETAILED DESCRIPTION

Disclosed herein are electrically reprogrammable fuse (eFUSE) devices and non-volatile memory structures such as Phase Change Random Access Memory ("PCRAM" also referred to as "PRAM"), as well as arrays thereof using externally heated, phase change material. Such devices may be advantageously integrated at a gate-level of device formation (i.e., at the front-end-of-line), thereby involving minimal changes to standard CMOS processing technology.

Certain phase change materials (such as Ge—Sb—Te (GST) alloys) have a programmable electrical resistance that changes with temperature. Other compositions such as $GeSb_4$, (including substitution/addition of other elements) are also possible for the phase change materials. Individual phase change elements (PCE) are thus used as programmable eFUSEs or as the storage cells of a memory device. The state of an individual PCE is programmed through a heating and cooling process which is electrically controlled by passing a current through the PCE (or a discrete heating element in proximity to the PCE) and the resulting ohmic heating that occurs. Depending upon the specific applied temperature and duration of heating applied to the PCE element, the structure is either "set" to a lower resistance crystalline state or "reset" to an amorphous, higher resistance state. Essentially, there is no practical limit to the number of times a PCE element may be programmed from the crystalline state to the amorphous state and vice versa.

The changing of the phase of a PCE typically requires a high temperature (e.g., considerably above the PCM melting temperature of about 600° C.), as can be obtained by Joule heating from current flowing through the phase change material or discrete resistor. When the phase change material is heated above its melting temperature to thereafter be quickly cooled, the phase change material becomes amorphous to result in a severed electrical connection in the case of an eFUSE, or to store a data bit of one logical value in the case of a memory element. Alternatively, when the phase change material is heated above its crystallization temperature and maintained at that temperature for a predetermined time before cooling, the phase change material becomes crystalline to result in a restored electrical connection in the case of an eFUSE, or to store a data bit of the opposite logical value in the case of a memory element.

Figure 1:
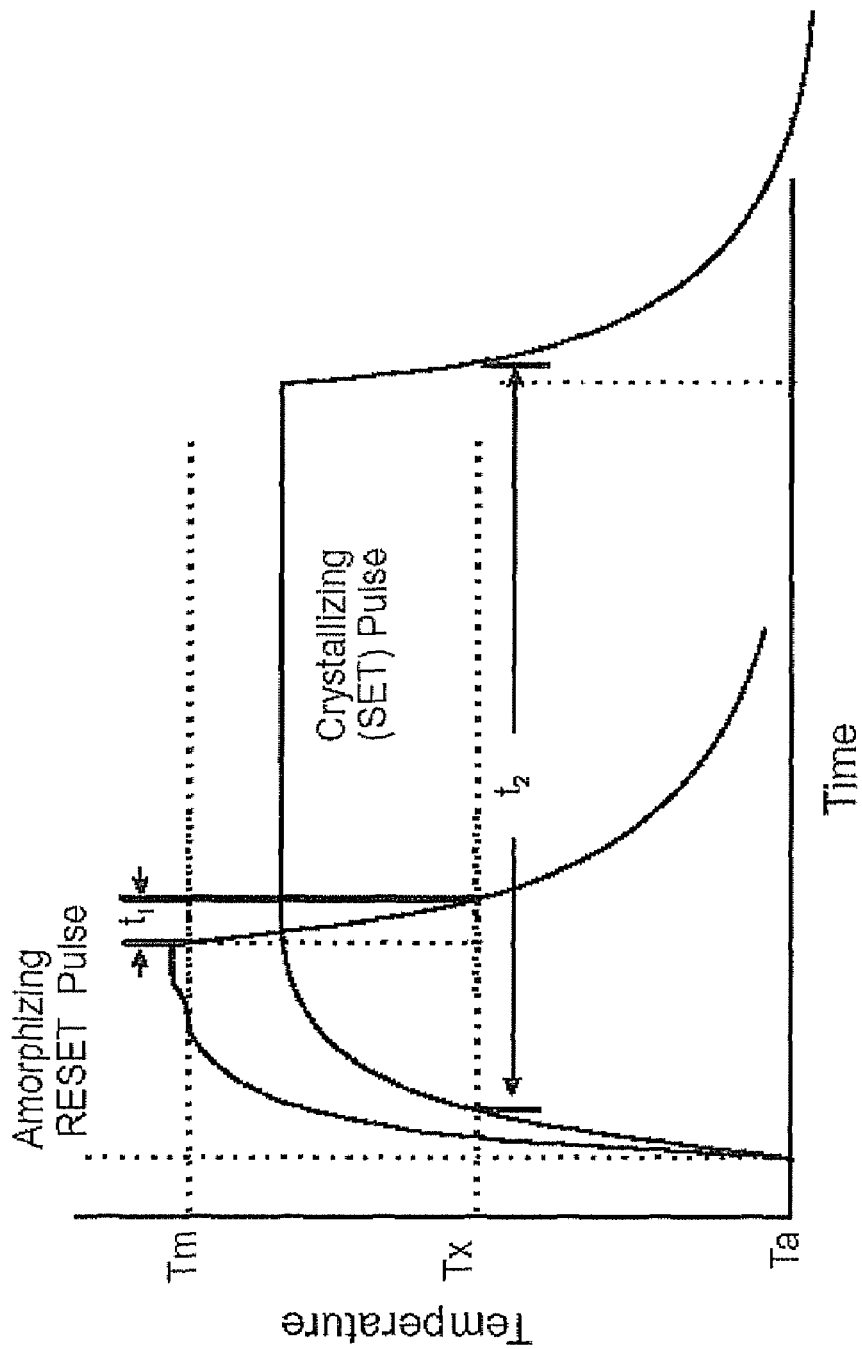
FIG. 1 is a graph illustrating the exemplary thermal cycling operations of a phase change material.

More specifically, FIG. 1 is a graph illustrating the exemplary thermal cycling operations of a phase change material. As is illustrated, a first thermal cycling operation includes a "RESET" pulse for converting the PCM from crystalline to amorphous form, and a second thermal cycling operation includes a "SET" pulse for converting the PCM from amorphous to crystalline form. During the RESET pulse, the temperature of the PCM is raised above its melting temperature ($T_m$), followed by a rapid quench over a short time $t_1$. As a result of the rapid quench, the disordered arrangement of atoms of the PCM due to the melt is retained. Thus, the PCM is left in an amorphous, high resistive state after the RESET pulse. During the SET pulse, the PCM is annealed at a lower temperature with respect to the melting temperature, and for a longer time $t_2$ with respect to $t_1$. This process enables the amorphous form to crystallize into a lower resistive state.

From a practical standpoint, some of the design requirements for a PCM-based eFUSE or non-volatile memory device include the capability of functionally perform the SET and RESET operations for a very large number of cycles (e.g., on the order of about $10^{11}$), the capability of reading/sensing the state of the fuse/memory element, the limitation on the amount of power/current needed to program the PCM, and the need to minimize the cost and time requirements to implement the structure with minimal changes to standard CMOS processing.

Figures 2A, 2B, 2C:
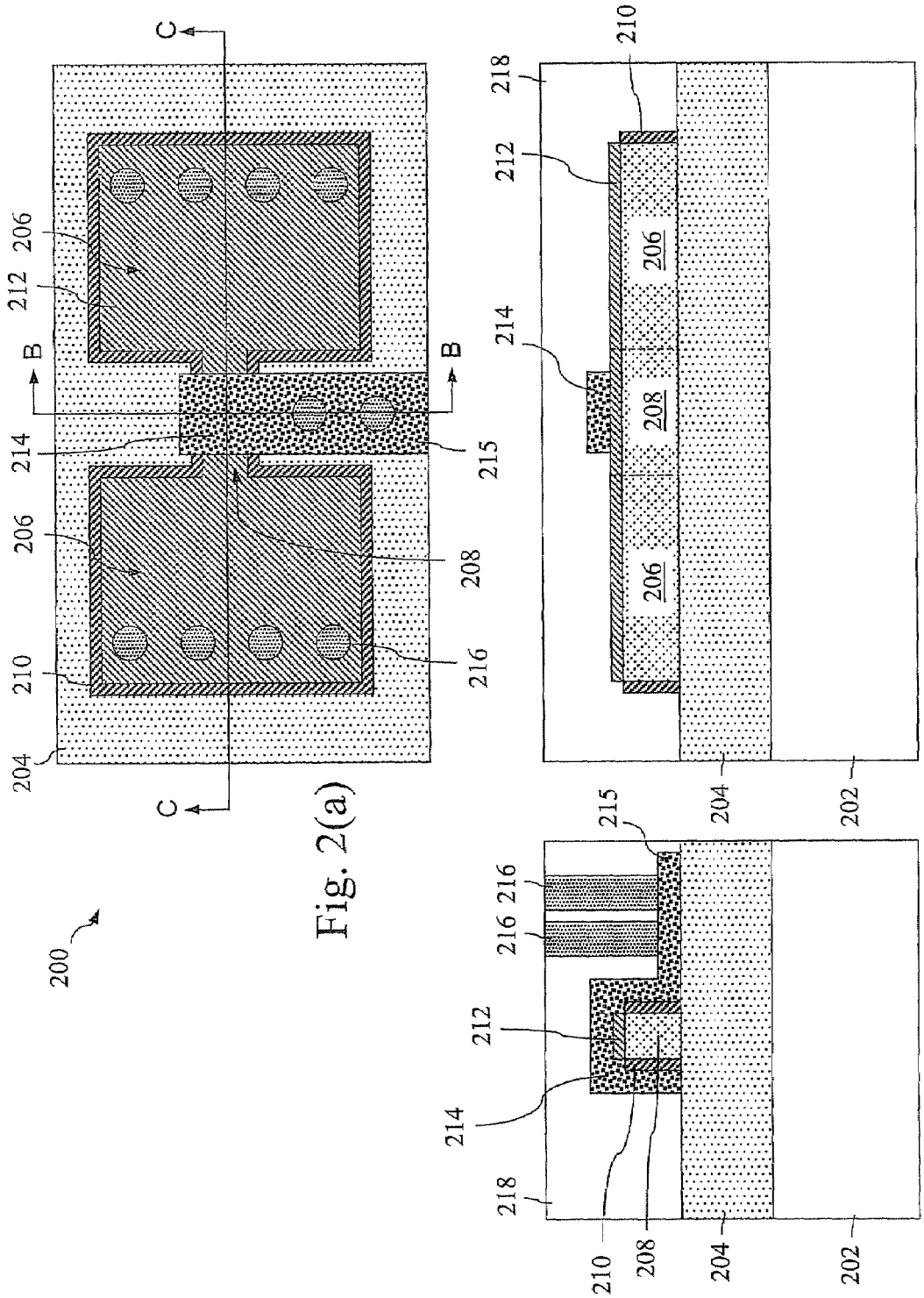
FIGS. 2(a) through 2(c) are top and cross-sectional views of a programmable eFUSE device using an externally heated PCM, formed at the gate-level of device processing, in accordance with an embodiment of the invention.

Referring now to FIGS. 2(a) through 2(c), there are shown various top and cross-sectional views of a programmable eFUSE device using an externally heated PCM, and which is formed at the gate-level of device processing, in accordance with an embodiment of the invention. In the exemplary single-cell implementation depicted, formation of the eFUSE structure is based upon two gate-level steps in the CMOS process: undoped polycrystalline silicon formation and silicide formation, along with the addition of an additional PCM level and associated vias. The patterned polysilicon (normally used as gate structures in standard CMOS processing) forms a thin wire structure (having a thin silicide layer formed thereupon) connecting two large pads or electrodes. The silicide layer is used as a metallic conductor and forms the heater for the eFUSE device. The PCM is formed so as to overlap the thin wire structure (and silicide material) in a direction transverse thereto. Thus configured, the metallic silicide connects the two electrodes with a low-resistance link, thereby forming the external heater used to program the state of the overlapping PCM. From a thermal standpoint, the polysilicon wire structure is the dominant heat conductor of the external heater structure.

More specifically, FIG. 2(a) is a top view of a programmable eFUSE structure 200, FIG. 2(b) is a cross-sectional view taken along B-B of FIG. 2(a), and FIG. 2(c) is a cross-sectional view taken along C-C of FIG. 2(a). As particularly illustrated in the cross-sectional views of FIGS. 2(b) and 2(c), a substrate 202 (e.g., silicon, silicon-on-insulator, etc.) has an insulating layer (e.g., shallow trench isolation) 204 formed thereon. During a polysilicon formation process, polysilicon material formed over the insulating layer 204 is patterned so as to form the heater electrodes 206, as well as the thin wire structure 208 that electrically connects the heater electrodes 206. As also used in CMOS processing, a thin layer of oxide 210 covers the sidewalls of the electrodes 206 and wire structure 208.

As also part of a CMOS process, the polysilicon material is provided with silicide metal contacts for ohmic contact with upper wiring levels. As is known in the art, a silicide layer 212 is formed over polysilicon by deposition of a suitable refractory metal (e.g., cobalt, nickel, titanium, tantalum, tungsten, platinum, erbium, ytterbium, etc.) followed by a high-temperature anneal. The portions of the metal layer in contact with silicon react with the silicon during the anneal to form a conductive silicide metal layer. As this is a self-aligning process with respect to silicon, it is also known in the art as a "salicide" process.

Following the silicide metal formation, a layer of PCM 214 is formed over the heater element in a generally perpendicular direction with respect to the orientation of the wire structure 208, as best seen in FIG. 2(b). An extended portion 215 of the PCM 214 extends along the insulating layer 204 adjacent the wire structure 208 so as to provide a contact point for the functional portion of the eFUSE device (i.e., a point at which the programmed state of the fuse may be sensed). In particular, the extended portion 215 provides a surface upon which conductive vias 216 may be subsequently defined once an interlevel dielectric (ILD) layer 218 (not shown in FIG. 2(a)) is formed over the structure. Additional vias 216 are also formed on the heater electrodes 206 in order to run heating current through the wire structure 208. Sequential processing views illustrating the formation steps in further detail, as well as exemplary processing conditions, are presented hereinafter.

Figure 3:
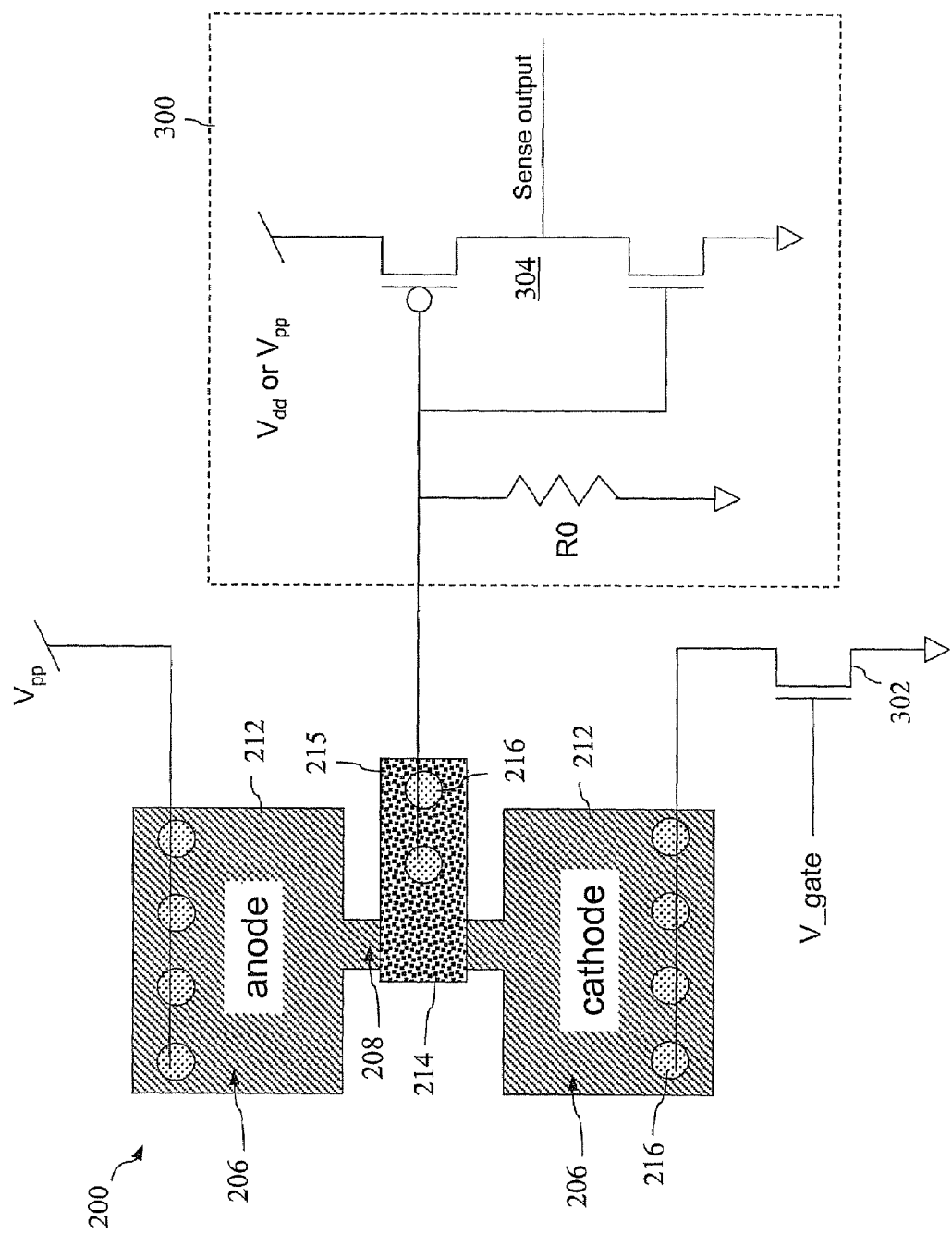
FIGS. 3 and 4 are schematic diagrams illustrating the operation of the programmable eFUSE structure of FIG. 2, in conjunction with an exemplary sensing circuit, in accordance with a further embodiment of the invention.

FIG. 3 is a schematic diagram illustrating the operation of the programmable eFUSE structure 200 of FIG. 2, in conjunction with an exemplary sensing circuit 300, in accordance with an further embodiment of the invention. The heater circuit (defined by electrodes 206 and connecting wire structure 208) is connected between a power supply $V_{pp}$ and ground through a programming FET 302, which has a control signal V_gate applied to the gate terminal thereof. The PCM layer 214 formed over the wire structure 208 has the extended portion 215 thereof connected (through vias 216) to an input node of a sense inverter 304, as well as to ground through a reference resistor R0.

In FIG. 3, it is initially assumed that, either through initial formation or specific programming to a crystalline state, the portion of the PCM layer 214 atop the wire structure 218 is in the low resistance state. During sensing of the state of the fuse device 200, FET 302 is deactivated, thus isolating the heater anode from ground. Because the entire PCM layer 214 is in a conductive (low resistance state), the power supply voltage $V_{pp}$ applied to the heater anode is also coupled to the extended portion 215 of the PCM layer 214, and thus built up across reference resistor R0. Since such a voltage (or other converted voltage suitable for use with the sense logic) represents a logical high voltage at the input node of the inverter 304, the sense output will be a logic low (ground) value.

Figure 4:
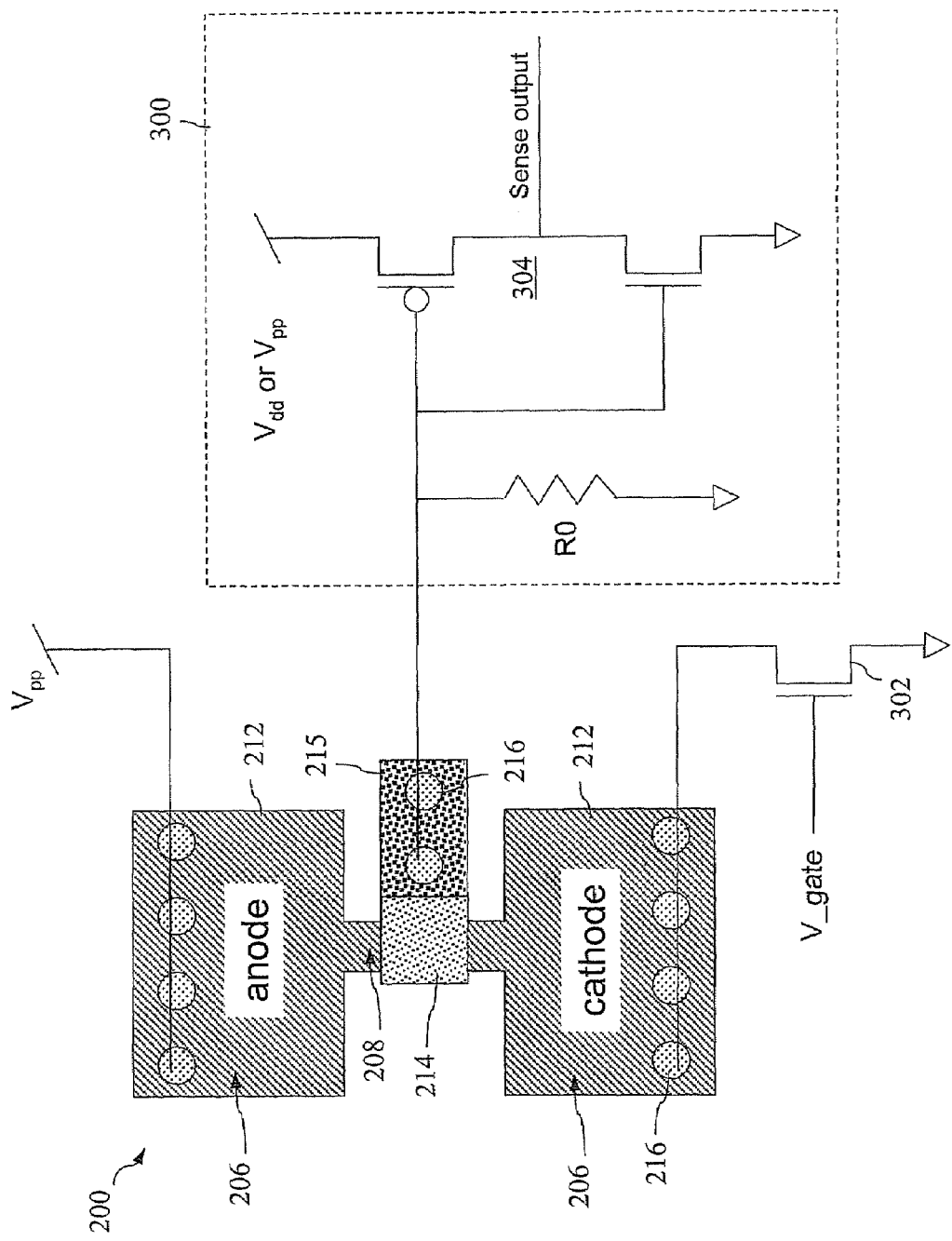

In order to convert the PCM layer 214 to the insulating state, the quench or RESET operation, the programming transistor 302 (e.g., an NFET) is activated by a relatively high input voltage on $V_{gate}$ to deliver a high current, followed by a rapid shut off of the transistor 302. Upon turning off the current through the heater, heat is rapidly conducted away from the silicide material 212 and PCM layer 214, through the polysilicon, resulting in a quench of the PCM 214. Accordingly, as a result of such a RESET operation, the portion of the PCM layer 214 in proximity to the silicide heater (shown in different shading in FIG. 4) is converted to the amorphous, high resistance state. In this case, since the current path between the power supply $V_{pp}$ and the PCM terminal (extended portion 215) is now blocked, the voltage on the input of the inverter 304 will discharge to ground through R0, thereby driving the sense output high.

Conversely, in order to restore the PCM layer 214 back to the conducting state, the anneal or SET operation is implemented by turning on transistor 302 with a relatively low input voltage on $V_{gate}$ to deliver a lower current with respect to the RESET operation, and thereafter shutting off transistor 302. The high resistance portion of the PCM layer 214 is annealed back to the low resistance, crystalline state shown in FIG. 3, thereby restoring the electrical connection between the PCM terminal (extended portion 215) and the power supply $V_{pp}$. The voltage of the inverter input node across R0 goes high, and the sense output is driven back to a low value.

Figures 5A, 5B, 5C:
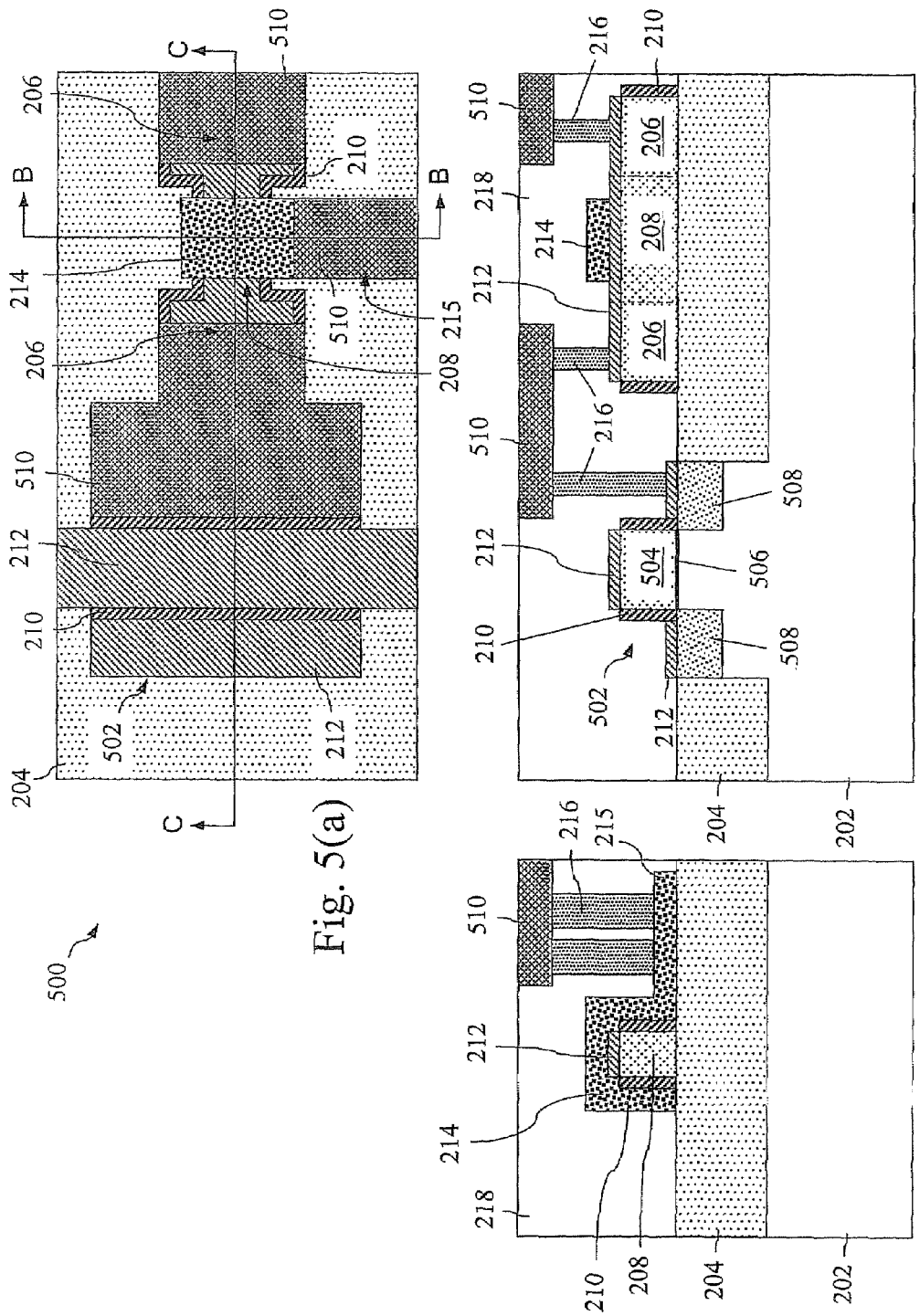
FIGS. 5(a) through 5(c) are top and cross-sectional views of a non-volatile memory cell using an externally heated PCM, formed at the gate-level of device processing, in accordance with a further embodiment of the invention.

As indicated above, in addition to reprogrammable eFUSEs, the structure of FIG. 2 can also be used as a non-volatile memory storage cell, such as for a PRAM device. Accordingly, FIGS. 5(a) through 5(c) illustrate various top and cross-sectional views of a non-volatile memory cell using an externally heated PCM, and which is formed at the gate-level of device processing, in accordance with a further embodiment of the invention. As will be noted, in comparison with the eFUSE embodiment of FIG. 2, the memory cell 500 in FIGS. 5(a) through 5(c) includes a substantially similar heater and PCM layer configuration, with the addition of a programming transistor 502 in series with one of the heater electrodes 206.

In particular, the programming transistor 502 include a polysilicon gate conductor 504 formed over a gate insulating layer 506, which is in turn formed over a non-insulated portion of the substrate 202. Integration of the programming transistor is fairly straightforward with respect to CMOS processing, including doping of the source/drain regions 508. It is noted that during silicidation, silicide contacts 212 are also formed over the silicon containing gate conductor 504 and source/drain regions 508. Also illustrated in FIGS. 5(a) through 5(c) is a first wiring layer 510 that is used, for example, to connect the programming transistor to one of the heater electrodes 206, as well as to connect the other heater electrode to the power source and connect the PCM layer 214 to the associated sense circuitry.

Figure 6:
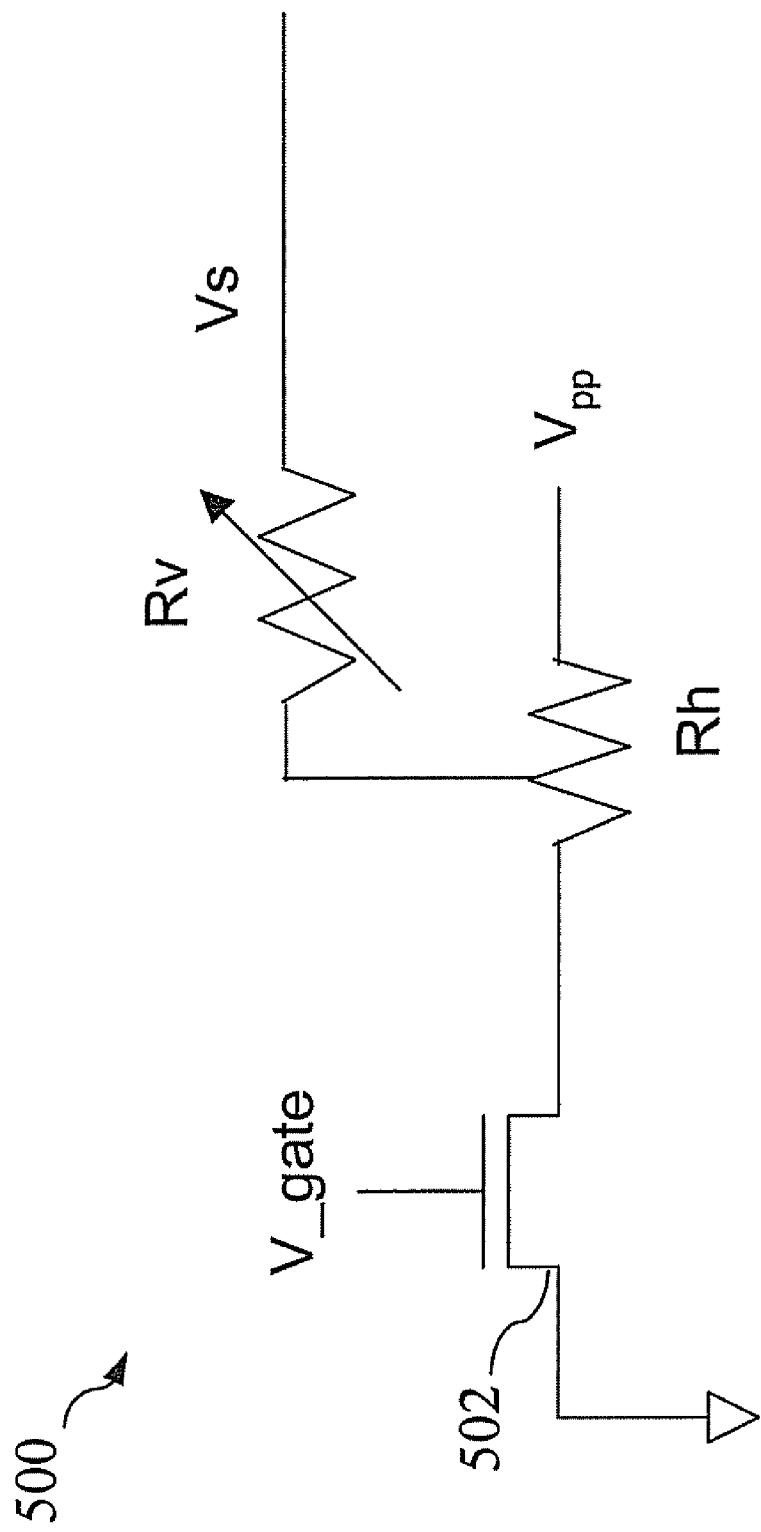
FIG. 6 is a schematic diagram illustrating the operation of the non-volatile memory cell of FIG. 5.

In contrast to the eFUSE embodiment, the sense circuitry associated with the non-volatile memory cell 500 does not typically rely on the heater supply voltage to supply an input signal thereto. This is schematically depicted in the schematic diagram of FIG. 6, wherein it will be noted that the power supply voltage $V_{pp}$ is separate from the sensing voltage, Vs, which is used as the input to the sense circuitry (not shown in FIG. 6). Generally speaking, to sense the state of the PCM memory cell, a non-zero voltage is applied to Vs (the sense terminal) and the gate of the programming transistor 502 is pulsed. The amount of current flowing through the PCM resistor, Rv, is dependent on the state of the PCM (i.e., large when it is in the low resistance crystalline state, and very low when it is in the high resistance amorphous state).

Figure 7A:
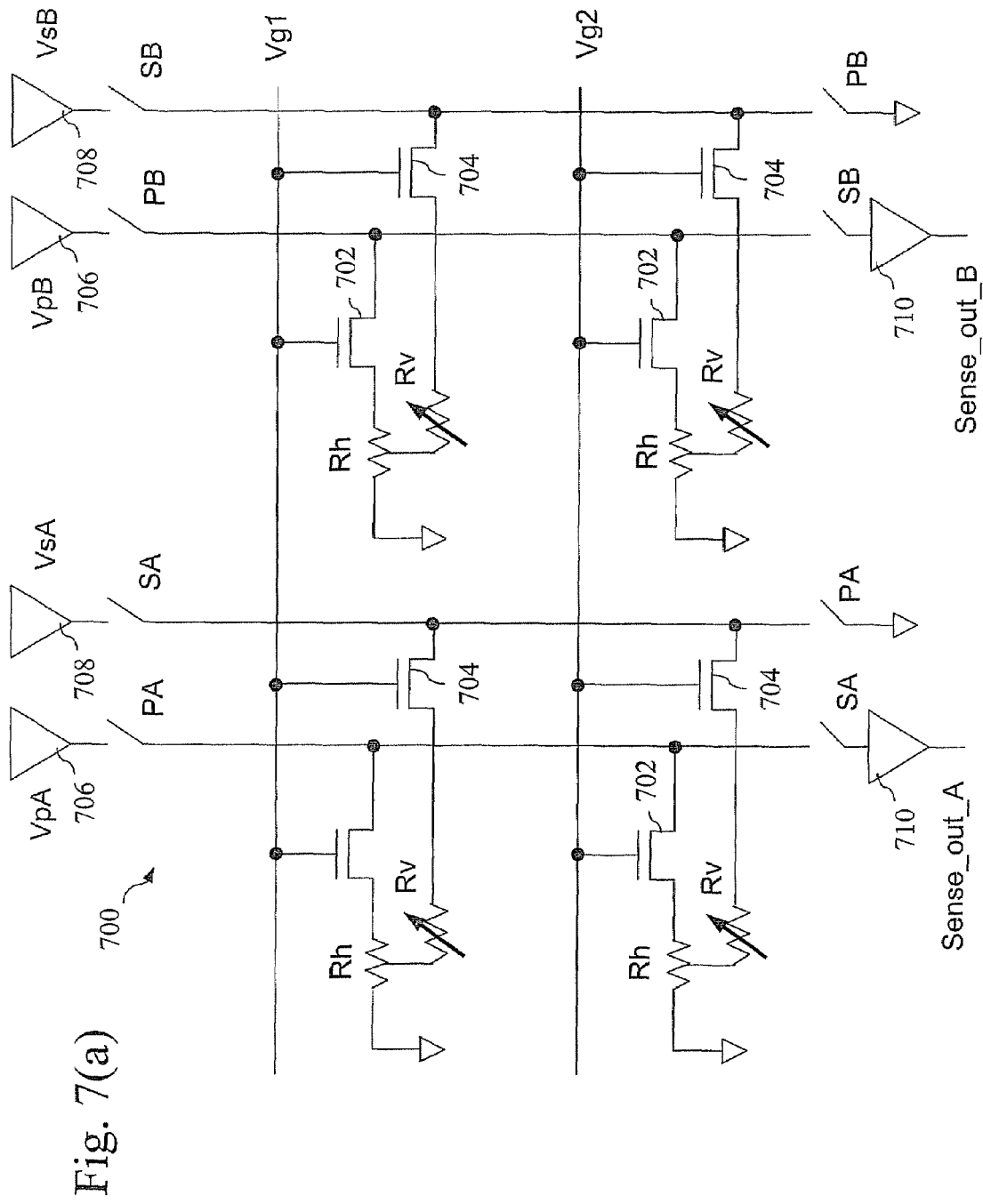
FIG. 7(a) is a schematic diagram illustrating an array of non-volatile memory cells using an externally heated PCM and associated sensing circuitry, in accordance with a further embodiment of the invention.
Figure 7B:
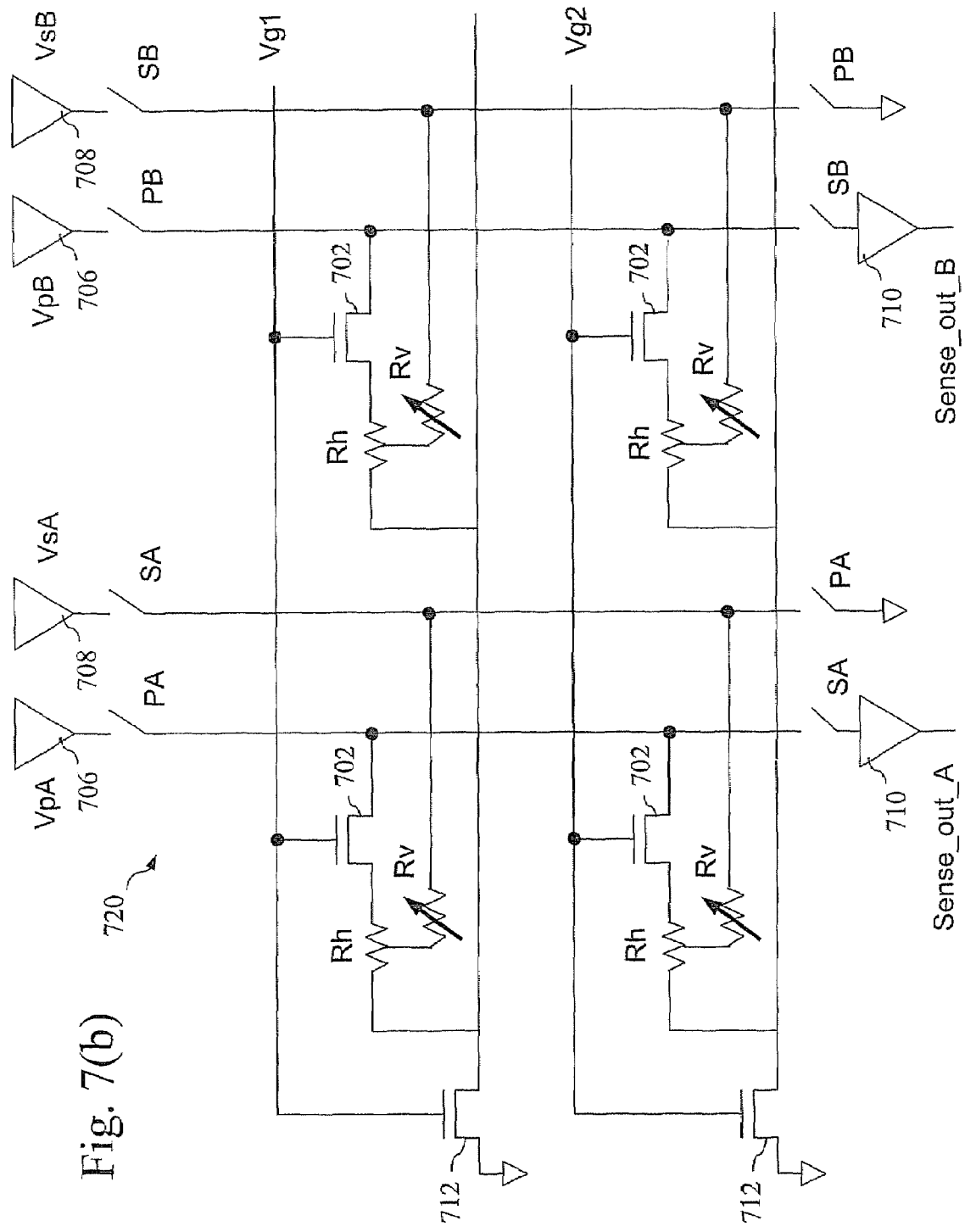
FIGS. 7(b) and 7(c) are alternative embodiments of the sensing circuitry for an array of non-volatile memory cells.
Figure 7C:
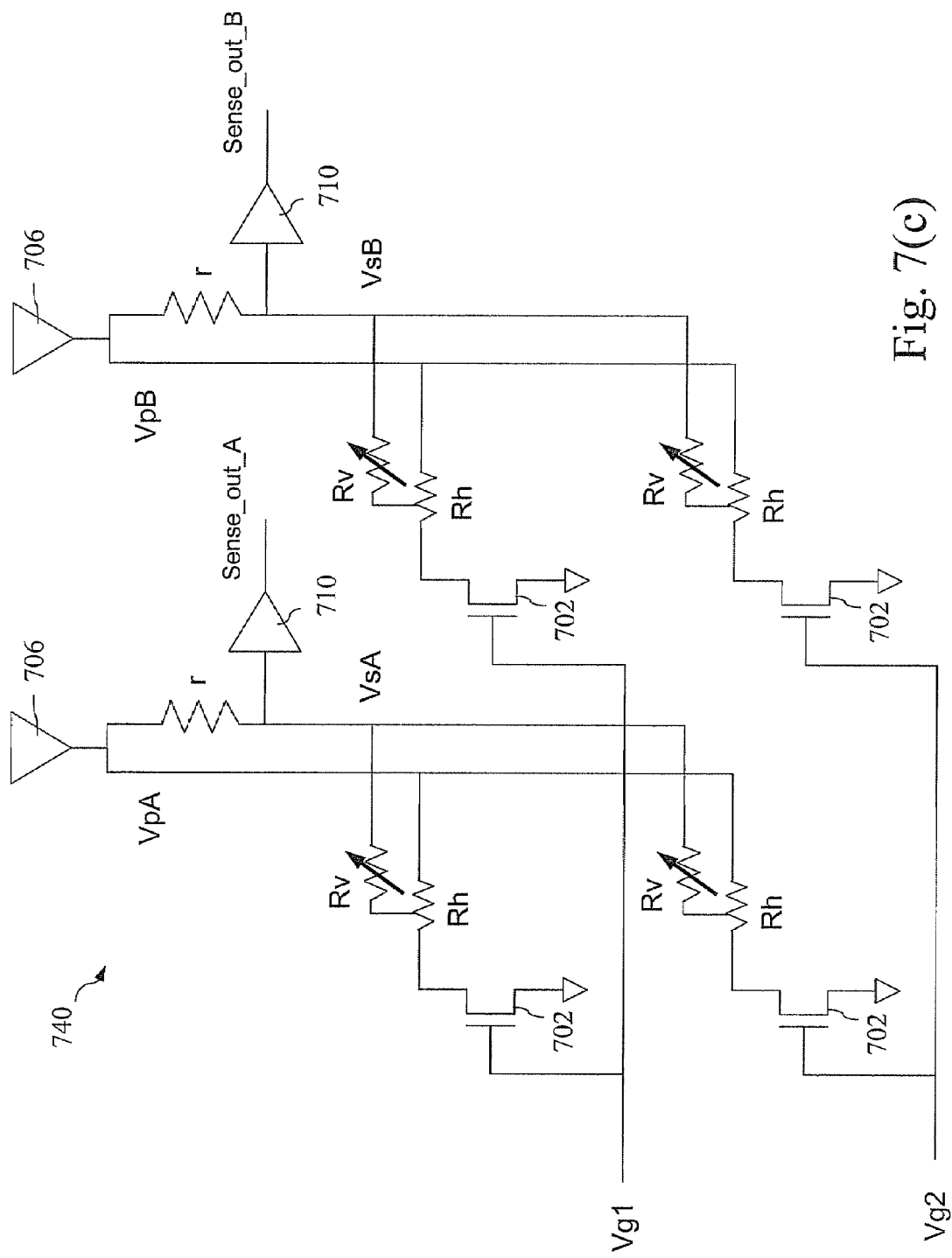

Referring generally to FIGS. 7(a) through 7(c), various embodiments of sensing circuitry for an array of PCM memory cells such as shown in FIG. 5 are depicted. For purposes of simplicity, the arrays are depicted as 2×2; however, it will be appreciated that the principles described herein are applicable to larger arrays.

FIG. 7(a) illustrates an exemplary sense array circuit 700. In addition to the programming transistors 702, each cell includes an additional sense transistor 704 configured to pass a lower current with respect to the programming transistor 702. This configuration prevents current from circulating between the program lines (PA, PB, etc.) and the sense lines (SA, SB, etc.) through non-selected cells in a given column. As also shown in FIG. 7(a), an adjustable power supply 706 (VpA, VpB, etc.), and a fixed power supply 708 (VsA, VsB, etc.) is provided for each column, as is a sense current amplifier 710. These devices are connected to the column lines by switches PA, PB, etc., and SA, SB, etc. It will be noted that, for any of the sense circuit embodiments, the power supplies (e.g., both the adjustable and fixed power supplies 706, 708) may be located on the same circuit board as the sense array circuit 700, or they may be located on a different component altogether. In the latter instance, the off-chip sources would be coupled to corresponding power source nodes on the chip containing the sense array circuit 700.

In order to program a cell (for example, in column A) the PA switches are closed and the SA switches are opened. A programming (high) voltage is thus applied by the adjustable power supply 706 to the appropriate Vp line connected to the cell, and the gate line (e.g., Vg1, Vg2, etc.) corresponding to the cell to be programmed is pulsed. The magnitude and duration of the pulse is selected between one having a low magnitude and slow ramp down (e.g., low resistance for writing a logical 0) and one having a large magnitude and fast ramp down (e.g., high resistance for writing a logical 1). Optionally, programming can be done for all 0's or all 1's on the same gate line at the same time.

To sense (read) a cell in column A, for example, the PA switches are opened and the SA switches are closed. A sensing (low) voltage, below the programming threshold, is then applied to the sense line VsA, and the gate line (e.g., Vg1, Vg2, etc.) corresponding to the cell to be sensed is pulsed. A parallel output of all cells attached to the selected gate line is coupled to the corresponding current sense output 710, thus generating, for example, Sense_out_A in column A.

FIG. 7(b) illustrates an alternative embodiment 720 of the sense array circuit of FIG. 7(a), wherein the sense transistors 704 in each cell are instead replaced by a common transistor 712 for each row (gate line) in the peripheral circuitry. The operations for programming/sensing a single cell are the same as described in FIG. 7(a). It will be noted that in the FIG. 7(b) design, it may not be practical to simultaneously sense or program large numbers of cells in a selected row if the common transistor 712 has to be too large.

FIG. 7(c) illustrates still another embodiment of the sense array circuit 740 in which the sense current passed through Rv is converted to a voltage through a small reference resistor "r" (wherein r is on the order of about 1-100Ω). The value of the reference resistor is kept very small; otherwise, it would be shunted by up to N (where N is the number of rows, e.g., 512) resistors (Rv+Rh/2) between the sense and programming lines. Shunting leads to an undesired dependence of the sense output on the state of the memory rather than just the state of the selected cell. Hence, r<(Rv+Rh/2)/N, where Rv is the resistance value of the PCM in the crystalline state. Because of the small value of r, the column sense amplifiers 710 are pulse voltage-amplifiers having a high gain of order N (e.g., on the order of about 1000); their design is facilitated by the low source resistance r. It will also be noted that a single adjustable power supply 706 (VpA, VpB, etc.) is provided per column. In this embodiment, significant current circulating between the program and sense lines in a given column in non-selected cells is prevented by the close proximity of the voltages of the programming and sense lines.

The array of FIG. 7(c) is programmed by application of a high voltage to the appropriate Vp line (A, B, etc.) connected to the cell, followed by pulsing the gate line for the cell. Again, the magnitude and duration of the pulse is selected between one having a low magnitude and slow ramp down (e.g., low resistance for writing a logical 0) and one having a large magnitude and fast ramp down (e.g., high resistance for writing a logical 1). Optionally, programming can be done for all 0's or all 1's on the same gate line at the same time. In order to sense the state of an array cell, a low voltage (below the programming threshold) is applied to the corresponding Vp line (A, B, etc.) connected to the cell, followed by pulsing the gate line for the cell. A parallel output of all cells attached to the selected gate line is coupled to the corresponding current sense output 710, thus generating, for example, Sense_out_A.

Notwithstanding the particular application of a PCM device as discussed above (e.g., reprogrammable eFUSE, non-volatile PRAM, etc.), certain key aspects of the operation of a PCM device include the quench time and the quench (RESET) power. For example, the quench time must be short (e.g., on a nanosecond time scale), in order for the melted PCM material cool to the amorphous state rather than recrystallizing. The power required to melt the material is supplied through a programming transistor, and the length of this transistor scales in accordance with the programming current supplied thereby. In addition, the transistor width is a main factor in the area per stored memory bit. Thus, minimizing programming power is a key factor in minimizing the area per bit.

3D Simulations of Heat Flow

Figure 8A:
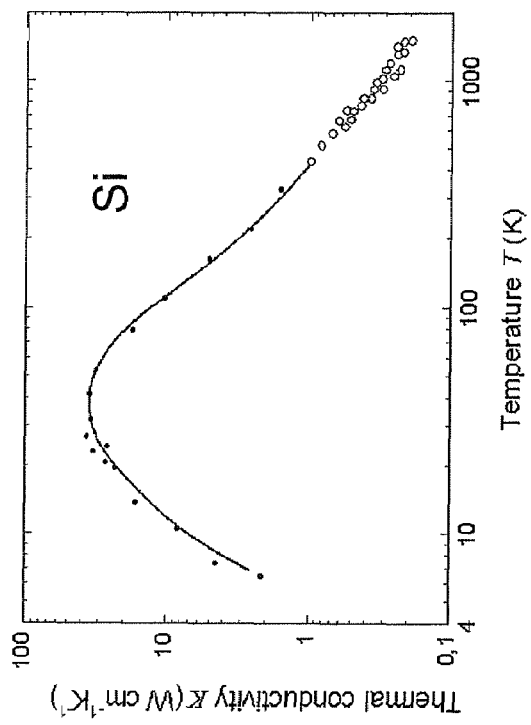
FIG. 8(a) is a graph illustrating the thermal conductivity properties of silicon as a function of temperature.
Figure 8B:
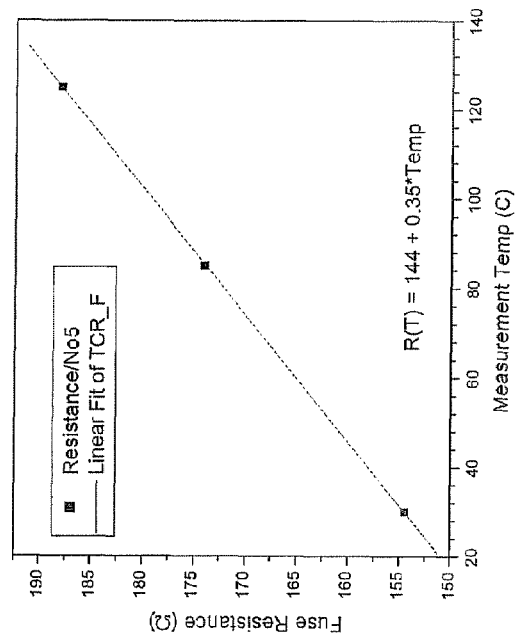
FIG. 8(b) is a graph illustrating the relationship of heater resistance as a function of heater temperature.
Figure 11A:
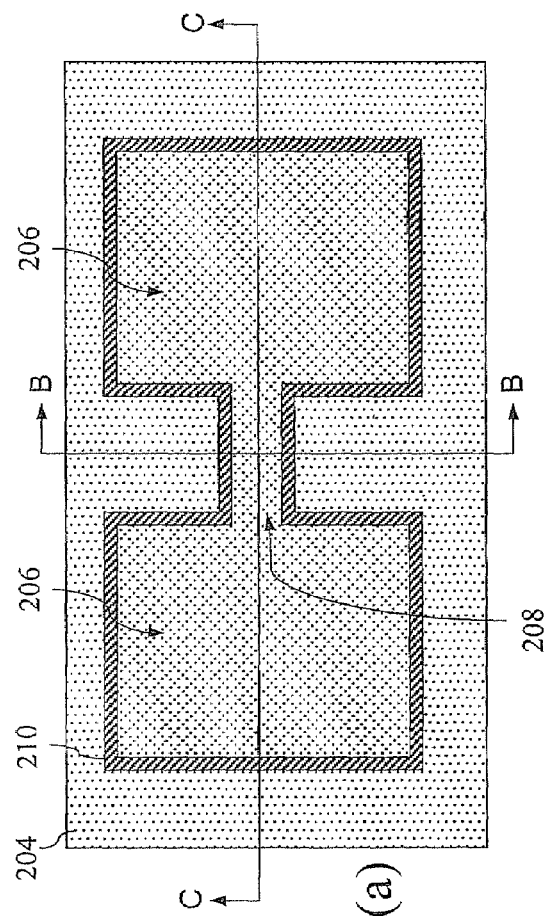
Figure 11C:
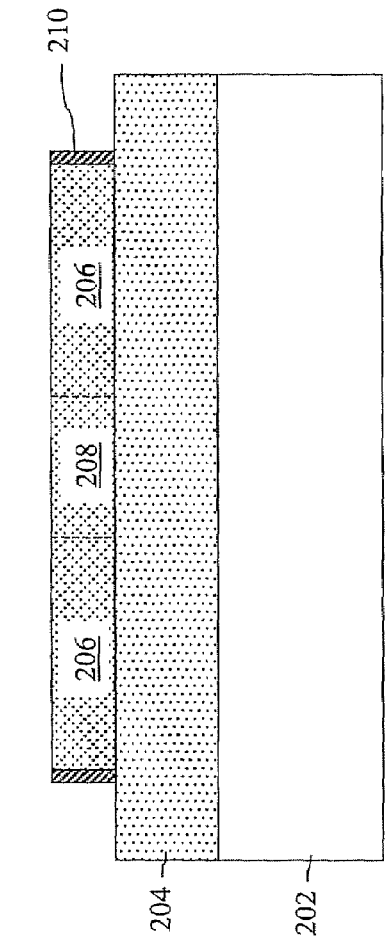
Figure 11B:
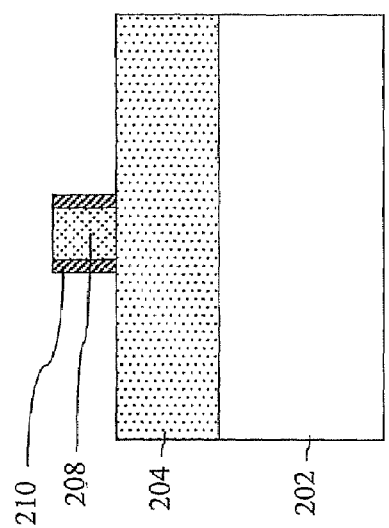

Thermal simulations are based on solving the thermal diffusion equation:

$$C_V dT/dt = \nabla K \nabla T + H$$

for the temperature T(r, t), with specific heat at constant volume, $C_V$, diffusion coefficient, K(T), and heating rate, H(r, t). Since the high thermal conductivity of the silicon wire plays a key role in both the thermal time constant and in the required power, it is important to take into account the substantial decrease in this thermal conductivity with increasing temperature, as reflected in the graph of FIG. 8(a). The approximate T-dependence of K over the operating temperature region is given by the expression $K=2113/T^{1.258}$ W/cm/K. The heating rate depends on current through the heater resistance, which is also temperature dependent, with the approximate behavior expressed by R=144+0.35 T(C) Ω, as shown in FIG. 8(b). Elsewhere, the conductivity and heat capacity are constant and typical for the corresponding materials.

Referring now to FIGS. 9(a) and 9(b), the results of a 3D simulation of a gate-level PCM eFUSE 900 similar to the embodiment of FIG. 2 are illustrated. The cross-sectional view of FIG. 9(a) generally corresponds to the view seen in FIG. 2(c), while the cross-sectional view of FIG. 9(b) generally corresponds to the view seen in FIG. 2(b). In the specific simulation illustrated, the eFUSE device 900 measured 1.28× 0.58×0.38 μm³ The cathode and anode in-plane dimensions are 0.3×0.3 μm², and the silicide strip (wire structure 208) connecting them is 0.40 μm long and 0.03 μm thick. The PCM 214 is 0.12 μm wide parallel to the silicide strip portion of the wire structure 208, and 0.05 μm thick. For constant current inside the silicide strip, the resistance R=144+0.35 T(C) causes the heating rate to vary with temperature in the same manner.

In the simulations depicted, a temperature dependent heating rate was applied to the silicide for 34 ns, followed by a zero heating rate for an additional 6 ns. The temperature increases at all locations of the device during the heating, causing the melting of all portions of the PCM 214 in contact with the silicide 212. Once the heating rate drops to zero, the temperature correspondingly decreases at all locations, but in particular, the temperature in the PCM 214 drops very suddenly (to below the melting temperature) within about 1 ns. This is fast enough to quench the PCM and render it non-conducting.

In particular, FIGS. 9(a) and 9(b) depict the temperature distribution just before quenching with an outer temperature contour 904 at about 255° C. and an inner temperature contour 902 at the PCM melting temperature, assumed to be 607° C. At this point, all of the PCM within the inner temperature contour 902 is melted. The average power input to the silicide during the heating phase is 2.4 mW. The peak temperature after 34 ns is about 847° C., which sufficiently low to preserve the integrity of the materials. Various other designs, dimensions, and heating rates were simulated as well, demonstrating the desired PCM melting temperatures with reasonably low applied power levels and low peak temperatures in the silicide material.

Materials Issues

In a physical implementation of the disclosed embodiments of the eFUSE and memory cell shown in FIGS. 2 and 5, the silicide material used in forming conductive contacts for FET devices at the substrate level is also used to form the electrodes and wire structure of the heater circuit. An exemplary process of record utilizes nickel mono-silicide (NiSi) doped with about 5% Pt as silicide metal. However, other di-silicide materials, such as $CoSi_2$ or $TiSi_2$, for example, may need to be considered, depending on the required power/temperature rise during the quench/anneal cycles. In the case of $CoSi_2$ or $TiSi_2$, existing processes of record for silicide contact formation are also available for ease of integration of the PCM devices into CMOS processing. The relative advantages or disadvantages of three different silicides are illustrated in FIG. 10.

Of the three silicides listed in FIG. 10, the melting temperature of NiSi is the lowest (less than 1000° C.), while that of $TiSi_2$ is the highest. The silicide stability at high temperatures (and thus the integrity of the heater/PCM interface during the quench/anneal cycling) affects the capability of maximizing the multishot (reprogrammablility) feature of the eFUSE/memory cell. As such, it is also contemplated that multiple silicide phases having different resistivities may be formed. However, changing silicide resistivity may be problematic in terms of controlling and managing power inputs during the quench/anneal cycles.

With regard to NiSi, certain challenges include more complex phase formation (multiple metal rich phases), the possibility of forming higher resistivity $NiSi_2$ in BEOL anneals, and lower morphological stability. On the other hand, one advantage of NiSi is that it addresses the problem of voiding in narrow polysilicon lines, provided that measures are taken to prevent other silicide phases from forming. This may be achieved by an additional doping (e.g., Re, Rh or Hf, in addition to Pt). Rutherford Backscattering Spectroscopy (RBS) analysis of a GST-225/NiSi (5% Pt) interface indicates stable at least up to about 505° C. This is in part due to a thin native (about 25 Å) $SiO_2$ layer on the surface of the silicide, which acts as a (inter) diffusion barrier. By adding a thin Ti layer at the interface to form GST-225/Ti/NiSi (5% Pt) stack, some interface reaction is taking place, since Ti is a very effective oxygen getter (by reducing the $SiO_2$ on the NiSi and/or diffusing into the GST). To maintain the integrity of the interface at high temperatures, a barrier layer of nitride or oxide may be used.

Manufacture

Finally, FIGS. 11 through 14 are top and cross-sectional views illustrating a more detailed, sequential description of an exemplary method of forming the eFUSE device of FIG. 2. As indicated previously, the structures in FIGS. 11(a) through 11(c) are formed in conformance with standard CMOS processing. First, the active areas are defined by forming the STI regions 204 on the substrate. The heating element, comprising the anode, cathode (electrodes 206) and the heater link (wire structure 208) is formed during the polysilicon conductor formation process (material deposition, lithographic patterning and etching) and the subsequent nitride spacer formation process.

Figure 12A:
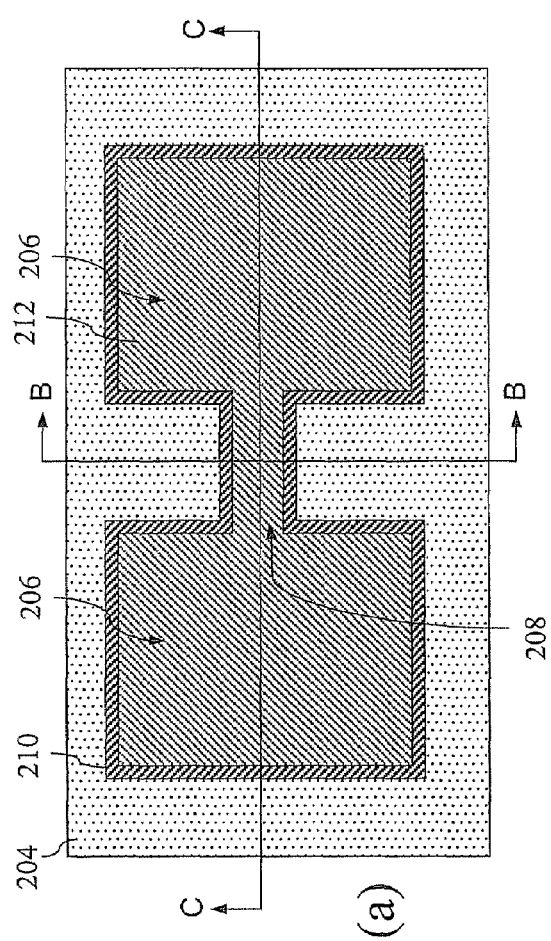
Figure 12C:
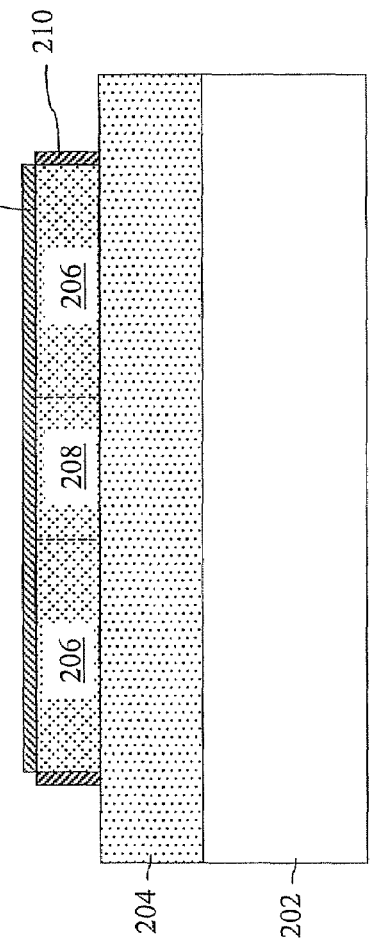
Figure 12B:
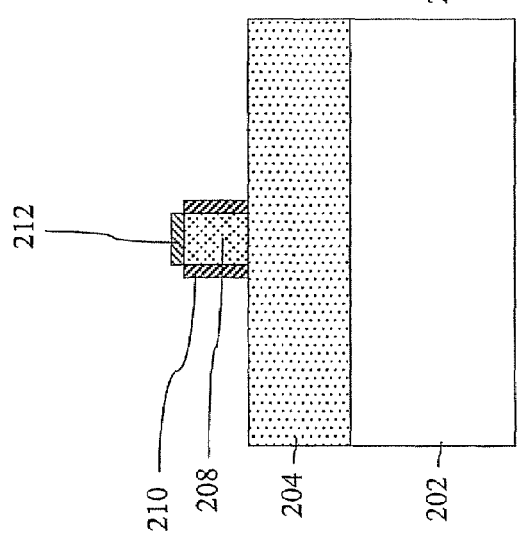

FIGS. 12(a) through 12(c) illustrate the device as a result the salicidation process. In an exemplary embodiment, the device is wet cleaned using 40:1 BHF (buffered hydrofluoric acid) for 45 seconds prior to the sputter deposition of about 8 nm of a NiPt alloy (95% Ni, 5% Pt) and 5 nm of TiN as a silicide metal material. A short time anneal of about 5 seconds is used to react the P+ polysilicon (120 nm) with the deposited NiPt (8 nm) to form about a 16 nm NiPt (95% Ni, 5% Pt) silicide layer 212. The unreacted NiPt metal is removed by etching in aqua regia (a mixture of 5 parts concentrated (37%) hydrochloric acid, 1 part concentrated (70%) nitric acid, and 4 parts deionized water) for several minutes. A second, longer duration homogenization anneal completes the silicidation at about 500° C.

Figures 13A, 13B, 13C:
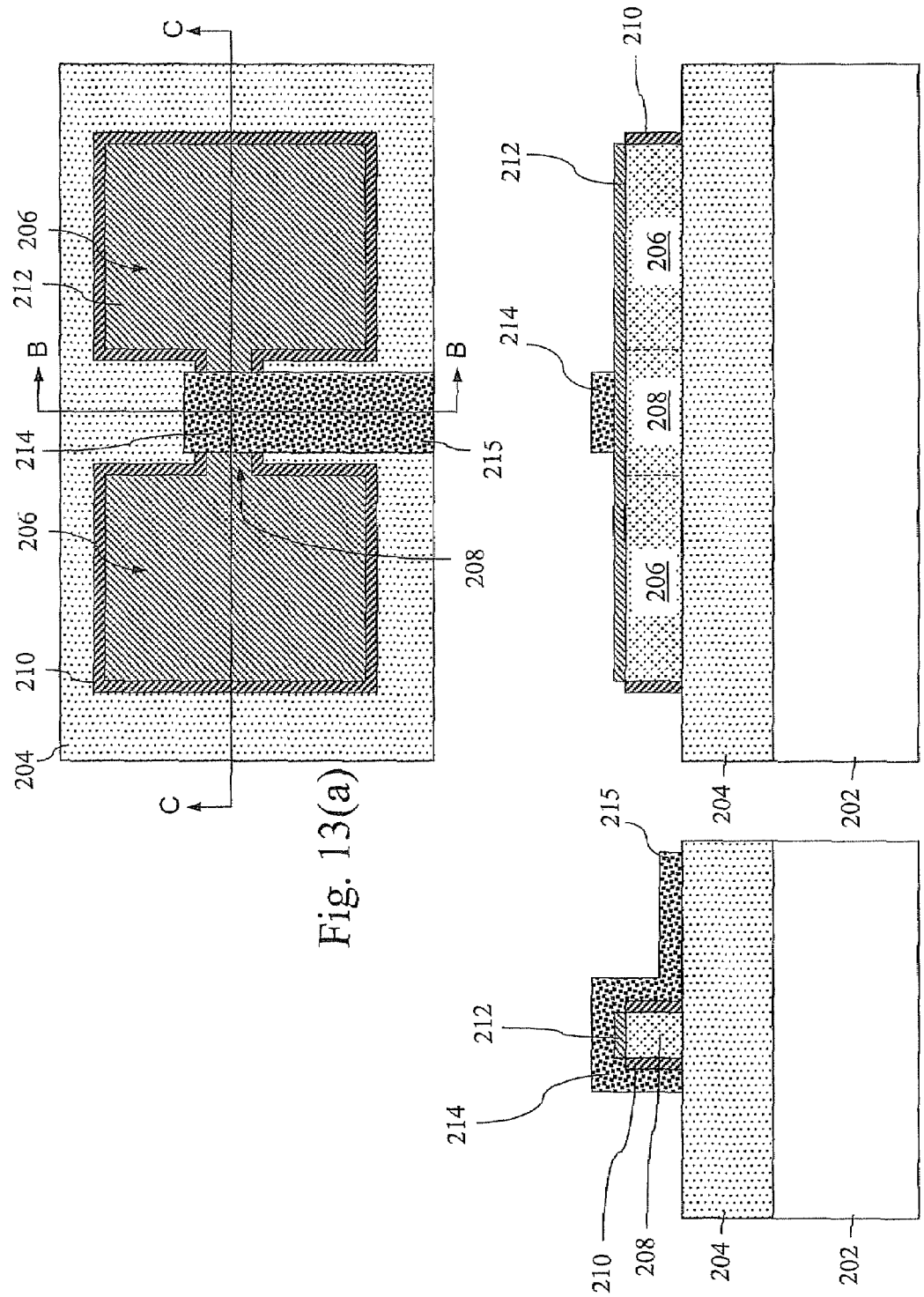

In FIGS. 13(a) through 13(c), an additional process for deposition and patterning of the PCM material 214 (e.g., GST) is shown. In FIGS. 14(a) through 14(c), the device is shown after MOL (middle of the line) dielectric deposition 218 and contact (via 216) formation. As known in the art, contact formation is implemented through lithographic patterning and etching of dielectric layer 218, followed by damascene metal (e.g., W) deposition and planarization. Subsequent processing is thereafter continued in accordance with standard logic processing techniques.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming a programmable phase change material (PCM) structure, the method comprising:
    forming a polysilicon layer over a semiconductor substrate, at a location corresponding to a transistor gate level of a semiconductor device;
    patterning the polysilicon layer so as to define a pair of electrodes and a thin wire structure connecting the electrodes;
    forming a silicide metal layer over the patterned polysilicon layer so as to define a heater element; and
    forming a layer of phase change material disposed on top of a portion of the thin wire structure of the heater element;
    wherein the portions of the silicide metal layer corresponding to the thin wire structure in contact with a portion of the phase change material are configured to selectively heat the portion of phase change material in a manner that programs the phase change material into one of a low resistance crystalline state and a high resistance amorphous state.

2. The method of claim 1, wherein the phase change material further comprises one of a Ge—Sb—Te (GST) alloy material and a $GeSb_4$ material.

3. The method of claim 1, wherein the silicide metal comprises one of: titanium silicide, cobalt silicide, nickel silicide, platinum silicide, tungsten silicide, tantalum silicide, erbium silicide and ytterbium silicide.

4. The method of claim 1, wherein a portion of the polysilicon layer is patterned as a gate electrode for a programming transistor connected in series with the heater element.

5. The method of 4, further comprising forming one or more contact vias on an extended portion of the phase change material not in direct contact with the thin wire structure, the one or more contact vias configured to provide a connection to sense circuitry configured to sense the resistance of the phase change material.

* * * * *